US006879507B2

(12) United States Patent
Abbott

(10) Patent No.: US 6,879,507 B2
(45) Date of Patent: Apr. 12, 2005

(54) CONDUCTIVE STRUCTURE FOR MICROELECTRONIC DEVICES AND METHODS OF FABRICATING SUCH STRUCTURES

(75) Inventor: Todd R. Abbott, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/215,915

(22) Filed: Aug. 8, 2002

(65) Prior Publication Data

US 2004/0029331 A1 Feb. 12, 2004

(51) Int. Cl.[7] .......................... G11C 5/06; G11C 11/34; H01L 21/8244
(52) U.S. Cl. ....................... 365/72; 365/188; 438/214
(58) Field of Search ................. 438/197, 214, 438/279; 365/51, 63, 72, 174, 182, 188

(56) References Cited

U.S. PATENT DOCUMENTS

| | | | |
|---|---|---|---|
| 3,891,190 A | 6/1975 | Vadasz | |
| 5,599,728 A | 2/1997 | Hu et al. | |
| 5,741,735 A | 4/1998 | Violette et al. | |
| 5,945,707 A | 8/1999 | Bronner et al. | |
| 5,963,818 A | 10/1999 | Kao et al. | |
| 6,037,194 A | 3/2000 | Bronner et al. | |
| 6,054,355 A | 4/2000 | Inumiya et al. | |
| 6,083,827 A | 7/2000 | Lin et al. | |
| 6,103,579 A | 8/2000 | Violette | |
| 6,141,239 A | 10/2000 | Manning | |
| 6,172,387 B1 | 1/2001 | Thakur et al. | |
| 6,174,764 B1 | 1/2001 | Manning | |
| 6,194,301 B1 | 2/2001 | Radens et al. | |
| 6,200,895 B1 | 3/2001 | Givens et al. | |
| 6,225,170 B1 | 5/2001 | Ibok et al. | |
| 6,258,679 B1 | 7/2001 | Burns et al. | |
| 6,261,905 B1 | 7/2001 | Chen et al. | |
| 6,261,947 B1 | 7/2001 | McTeer | |
| 6,287,926 B1 | 9/2001 | Hu et al. | |
| 6,548,871 B1 | 4/2003 | Horita et al. | |
| 6,569,723 B2 * | 5/2003 | Liaw | 438/453 |
| 2003/0042546 A1 | 3/2003 | Abbott | |

OTHER PUBLICATIONS

Hodges & Jackson, Analysis and Design of Digital Integrated Circuits, 2nd Edition, Mc–Graw–Hill, Inc., 1988, pp. 364–368.*
Muller & Kamins, Device Electronics for Integrated Circuits, 2nd Edition, John Wiley & Sons, 1986, p. 417.*
Wolf, S. and Tauber R.N., Silicon Processing for the VLSI Era, vol. 1: Process Technology, pp. 280–282, 397–399, ISBN 0–961672–3–7, Lattice Press, Sunset Beach, California, 1986.
Wolf, Stanley, Silicon Processing for the VLSI Era, vol. 2: Process Integration, pp. 20–22, 39–41, ISBN 0–961672–4–5, Lattice Press, Sunset Beach, California, 1990.

* cited by examiner

Primary Examiner—Evan Pert
(74) Attorney, Agent, or Firm—Perkins Coie LLP

(57) ABSTRACT

A conductive structure for gate lines and local interconnects in microelectronic devices. The conductive structure can be used in memory cells for SRAM devices or other types of products. The memory device cell can comprise a first conductive line, a second conductive line, a first active area, a second active area, a third active area, and a fourth active area. The first conductive line includes a first gate, a second gate, a first contact and a second contact. The second conductive line includes a third gate, a fourth gate, a third contact and a fourth contact. The first active area is electrically coupled to the first gate and the third contact; the second active area is electrically coupled to the second gate and the fourth contact; the third active area is electrically coupled to the third gate and the first contact; and the fourth active area is electrically coupled to the fourth gate and the second contact. The memory cell device, for example, can be a cell for an SRAM device. As such, other embodiments of memory devices further include a first access transistor electrically coupled to the second conductive line, and a second access transistor electrically coupled to the first conductive line.

34 Claims, 11 Drawing Sheets

CONDUCTIVE STRUCTURE FOR MICROELECTRONIC DEVICES AND METHODS OF FABRICATING SUCH STRUCTURES

TECHNICAL FIELD

The present invention relates in general to fabricating conductive structures, such as interconnects and gates, in the manufacturing of microelectronic devices.

BACKGROUND

Manufacturers of microelectronic devices are continually reducing the size and increasing the density of components in integrated circuits to (a) increase the speed and capacity of a device and (b) reduce power consumption. For example, to increase the capacity of a memory device, such as an SRAM device, it is highly desirable to reduce the size of each memory cell without impairing performance. Memory device manufacturers accordingly seek to reduce the size and/or increase the density of components in memory cells.

As integrated circuits are scaled down, it becomes more difficult to fabricate the individual components, which increases the cost of fabricating integrated circuits. For example, as memory cells in SRAM devices shrink, several micro-fabrication processes require extensive development to form such small structures with the necessary precision and repeatability for production level processing. The equipment and procedures for producing ever smaller components accordingly becomes more expensive.

One process that may become a limiting factor for producing the small components in high performance devices is photolithography. As a result, every masking step dramatically increases the cost of manufacturing a given device. A typical damascene gate structure, for example, requires three or more deposition and planarizing steps. Photolithography (i.e., pattern/etch) is thus an expensive aspect of forming damascene gate structures and interconnects in memory devices, processors and other devices. As a result, there is a continuing need for structures and manufacturing methods to form damascene gates and interconnects with a high degree of consistency and reliability.

SUMMARY

The present invention is directed toward forming gate lines and interconnect structures. In one embodiment, a damascene gate line and a damascene local interconnect are formed using a single mask and deposition process. By combining the formation of damascene gates and local interconnects into a single process, low resistance wordlines and shorter gate lengths can be formed, and the resistance from the local interconnect to the gate contact can be reduced or even eliminated. Further, several embodiments provide different layouts of active areas to form small memory cells in a production level environment. As such, several embodiments of the present invention are particularly well suited for fabricating SRAM devices.

In accordance with one embodiment of the present invention, isolation trenches are formed in a base substrate. An ILD layer is deposited over the base substrate, and then the ILD layer is patterned and etched to define gate/local interconnect damascene trenches. Any residual resist material is then stripped away. A layer of gate oxide is formed at least within the gate/local interconnect damascene trenches at areas where gates are to be formed. If oxide is formed on the base substrate in the contact areas for local interconnects, a patterned oxide etch is performed to remove at least a portion of the oxide at the contact areas within the gate/local interconnect damascene trenches. Any desired implants are performed and then resist is stripped from the workpiece.

A conductive layer is deposited over the structure filling the damascene trenches to provide the conductive material for both damascene gates and local interconnects in a single deposition procedure. A polishing process is then performed to remove the overburden of the conductive layer back to the ILD layer. Next, the ILD layer is stripped and spacers are formed on the sides of the gates and local interconnects. After forming the spacers, any additional doping or implanting is performed. For example, the base substrate is generally doped to define source and drain regions of active areas. Finally, the back end of line wiring is completed.

Other embodiments of the invention are directed toward memory cells and computers having memory devices. The memory device cell can comprise a first conductive line, a second conductive line, a first active area, a second active area, a third active area, and a fourth active area. The first conductive line includes a first gate, a second gate, a first contact and a second contact. The second conductive line includes a third gate, a fourth gate, a third contact and a fourth contact. The first active area is electrically coupled to the first gate and the third contact; the second active area is electrically coupled to the second gate and the fourth contact; the third active area is electrically coupled to the third gate and the first contact; and the fourth active area is electrically coupled to the fourth gate and the second contact. The memory cell device, for example, can be a cell for an SRAM device. As such, other embodiments of memory devices further include a first access transistor electrically coupled to the second conductive line, and a second access transistor electrically coupled to the first conductive line.

The layout of the memory device cells and the conductive lines can have different configurations. In one embodiment, the first conductive line is a contiguous first line and the second conductive line is a contiguous second line that are both formed from a single photo/etch process and a single deposition process. The first and second conductive lines can be metal lines, polysilicon lines, or other contiguous lines from conductive materials. The first and second conductive lines can be individual straight conductive segments. Other embodiments include a first conductive line that has a first shape and a second conductive line that has a second shape that surrounds at least a portion of the first conductive line. The first conductive line can have an inverted U-shape and the second conductive line can have an upright U-shape around at least a portion of the first conductive line.

BRIEF DESCRIPTION OF THE DRAWINGS

The following detailed description of embodiments of the present invention can be best understood when read in conjunction with the following drawings. Similar or identical structures are identified by like reference numerals throughout the figures.

DETAILED DESCRIPTION

The following detailed description of preferred embodiments refers to and includes the accompanying drawings. It will be appreciated that the following description and the corresponding drawings describe specific embodiments of the invention, but the invention is not limited to only the embodiments described herein. As such, other embodiments may be utilized, and changes may be made to the embodiments described herein without departing from the spirit and scope of the present invention.

Additionally, the processes and structures described herein do not form a complete process flow for manufacturing integrated circuits. The present invention can be practiced in conjunction with a variety of integrated circuit fabrication techniques, including those techniques currently used in the art. As such, commonly practiced process steps are included in the description herein to enable a person skilled in the art to make and use embodiments of the present invention.

As used herein, the formation of a layer or region "over" a substrate or other layer refers to formation above, or in contact with, a surface of the substrate or layer. For example, where it is noted or recited that an insulating layer is formed over a substrate, it is contemplated that intervening structural layers may optionally be present between the insulating layer and the substrate.

Fabrication of a Gate and Local Interconnect Damascene Structure

Figure 1:
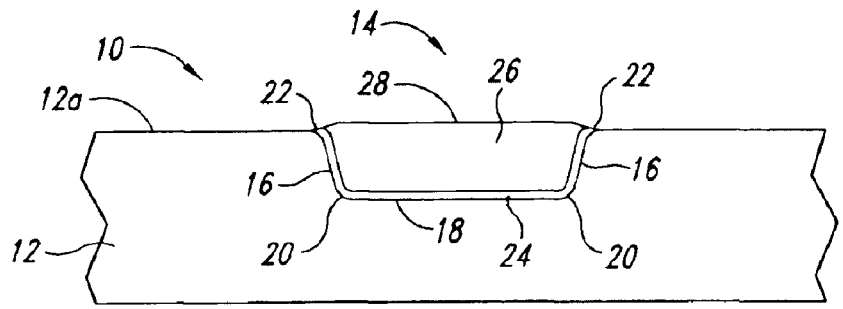
FIG. 1 is an illustration of a semiconductor base substrate having an isolation trench at one stage of fabrication according to one embodiment of the present invention.

As illustrated in FIG. 1, the semiconductor structure 10 comprises a base substrate 12 having an isolation trench 14. The base substrate 12 can be silicon or any other semiconductor material or combination of materials as is known in the art. For example, the substrate 12 can comprise gallium arsenide (GaAs) or other semiconductor materials such as InP, CdS, or CdTe. The isolation trench 14 defines an isolation region, and it is formed using any available techniques including, for example, shallow trench isolation (STI) methods. As illustrated, the isolation trench 14 includes first and second sidewalls 16, a trench floor 18 generally parallel to the surface 12a of the base substrate 12, rounded lower trench corners 20 and rounded upper trench corners 22. An optional first oxide layer 24 lines the isolation trench 14, and a first dielectric material 26 fills in the isolation trench 14. It will be appreciated that the isolation trench 14 may contain additional layers or have a different geometry depending upon the isolation characteristics desired.

The upper portion 28 of the first dielectric material 26 can be planar and generally parallel to the base substrate surface 12a (not shown). However, a small convex surface in the upper portion 28 of the first dielectric material 26 may result depending upon the techniques used to form the isolation trench. For example, to form STI structures, layers of oxide and nitride are deposited over the base substrate, and a mask is patterned over the nitride to define the isolation region (not shown). After etching and filling the isolation trench with the first dielectric material, the mask, nitride, and oxide layers are stripped from the base substrate. For example, a wet etch, such as a hot phosphoric acid or other suitable etchant is employed to remove the nitride layer and first dielectric layer generally above the isolation trench. However, the nitride layer may etch faster than the first dielectric material. As such, after removing the oxide with a buffered oxide etch (BOE) or other suitable etchant, the convex surface on the upper portion 28 of the first dielectric material 26 is formed as illustrated in FIG. 1. Such a construction generally will not affect the present invention, but it is undesirable to form a dish or divot in the first dielectric material 26 over the isolation trench 14.

Typically, ions are implanted in the base substrate 12 to form n-type and p-type wells. This process is preferably performed after forming the isolation trench 14, but may be performed before forming the trench 14. The wells define the locations of the n-channel and/or p-channel devices; the implant materials will accordingly be application specific. For example, to form a p-well, the base substrate 12 is implanted with a p-type dopant including, for example, trivalent elements such as boron. Likewise, to form an n-well, the base substrate 12 is implanted with an n-type dopant including, for example, pentavalent elements such as phosphorous. Further, ion implants may be embedded into the base substrate 12 through the isolation trench opening formed in the base substrate 12 before filling the isolation trench with the dielectric material 26.

Figure 2:
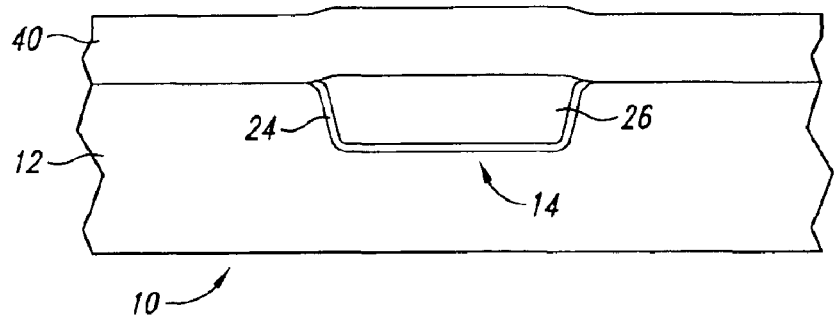
FIG. 2 is an illustration of a semiconductor structure at a subsequent stage of fabrication wherein an ILD layer is formed on the base substrate of FIG. 1 according to one embodiment of the present invention.

Referring to FIG. 2, an interlayer dielectric (ILD) layer 40 is deposited over the base substrate 12. The ILD layer 40 shown in FIG. 2 is substantially conformal, but this is not a requirement to practice the present invention. As such, there is no need to CMP or otherwise planarize the top surface of the ILD layer 40. As used herein, a conformal layer is a layer having a generally uniform thickness that follows the contours of the underlying layers. The ILD layer 40 may be any dielectric material suitable for subsequent processes and the intended application. Further, the thickness of the ILD layer 40 is selected according to the particular application. For example, when the ILD layer 40 forms a gate, the thickness of the ILD layer 40 generally defines the height of the conductive material used to form the gate as more fully described herein, and thus provides a manner to control the electrical characteristics of the gate.

Figure 3:
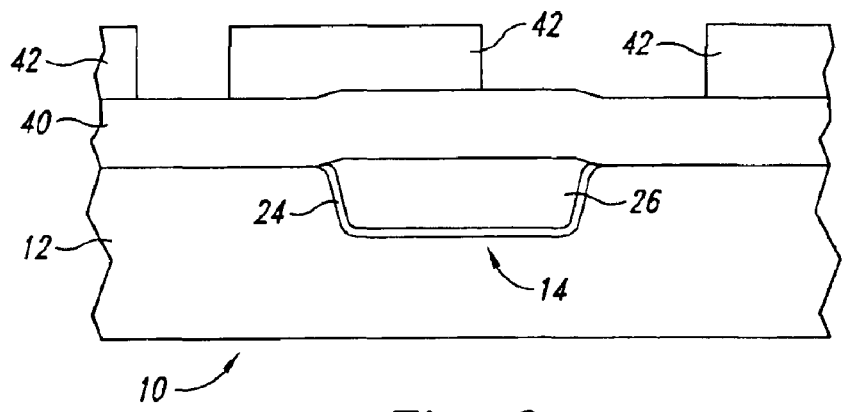
FIG. 3 is an illustration of a semiconductor structure at a subsequent stage of fabrication wherein a patterned mask is formed over the ILD layer of FIG. 2 according to one embodiment of the present invention.

Referring to FIG. 3, a second mask layer 42 is deposited over the ILD layer 40 and then patterned to define the desired openings in the ILD layer 40 for damascene gate/local interconnects or other components. The second mask 42 may be a photo resist layer or other types of layers.

Figure 4:
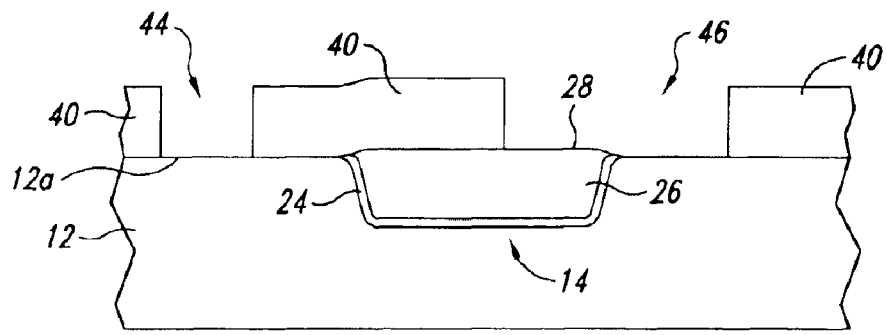
FIG. 4 is an illustration of a semiconductor structure at a subsequent stage of fabrication wherein gate/local interconnect damascene trenches are formed through the ILD layer, and the patterned mask of FIG. 3 is stripped away according to one embodiment of the present invention.

As illustrated in FIG. 4, an etching process is performed to define gate/local interconnect trenches 44, 46. While only two gate/local interconnect trenches 44, 46 are shown, any number of trenches for gate/local interconnects may be formed. Further, any combination of gates and local interconnects can be formed within each of the gate/local interconnect trenches 44, 46 as explained in more detail below. It will be appreciated that the gate/local interconnect trenches 44, 46 are formed in a single mask and etch operation, and then they can be filled with conductive material using a single deposition operation. This reduces the cost and complexity of manufacturing integrated circuits. The second mask 42 (not shown in FIG. 4) is then stripped off.

For illustrative purposes, FIGS. 4–13 show the formation of both a gate and a local interconnect. As will be seen, a gate is formed in the gate/local interconnect trench 44 and a local interconnect is formed in the gate/local interconnect trench 46. Each of the trenches 44, 46 can include a plurality of gate sites and a plurality of local interconnect sites. This allows the gate lines and the local interconnects to be formed from a single deposition of material.

Further, the gate/local interconnect trench 46 is illustrated partially overlying a portion of the isolation trench 14. However, this is only illustrative of the possible formations according to the present invention. For example, the gate/local interconnect trench 46 can be formed so as to avoid overlying a portion of the isolation trench 14.

Figure 5:
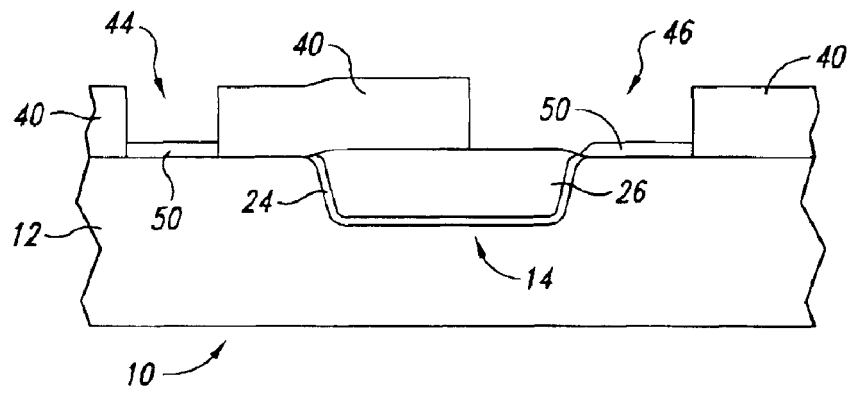
FIG. 5 is an illustration of a semiconductor structure at a subsequent stage of fabrication wherein an oxide layer is grown on the exposed silicon of the base substrate in the areas that were not covered by the oxide within the isolation trench or ILD layer FIG. 4 according to one embodiment of the present invention.

As illustrated in FIG. 5, a gate oxide layer 50 is grown on the base substrate 12. The gate oxide layer 50 can be grown by thermal oxidation of the base substrate 12, or by other conventional techniques such as chemical vapor deposition (CVD). It will be appreciated that growing the gate oxide layer 50 will form an oxide on any exposed silicon surface. As such, it may be necessary to remove the oxide from certain areas in the trenches 44, 46 to provide direct contact to the active areas for the local interconnects. As an example, oxide will grow on the base substrate 12 within the trenches 44, 46 where local connections are to be formed as illustrated by the gate/local interconnect trench 46.

Figure 6:
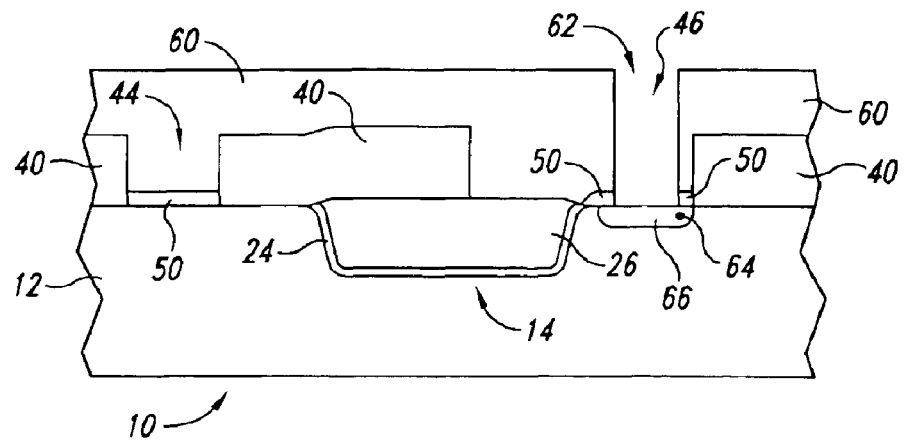
FIG. 6 is an illustration of a semiconductor structure at a subsequent stage of fabrication wherein a photoresist layer is patterned over the semiconductor structure of FIG. 5, portions of the oxide layer are removed, and materials are implanted into the base substrate according to one embodiment of the present invention.

As illustrated in FIG. 6, a third mask 60 is deposited over the structure 10 and patterned for etching undesired portions of the gate oxide layer 50 to define an active area contact or exhumed contact 62 generally within the area defining a local interconnect in the trench 46. The oxide may also be removed from portions of the trench 44 if local interconnects are also formed therein.

Figure 7:
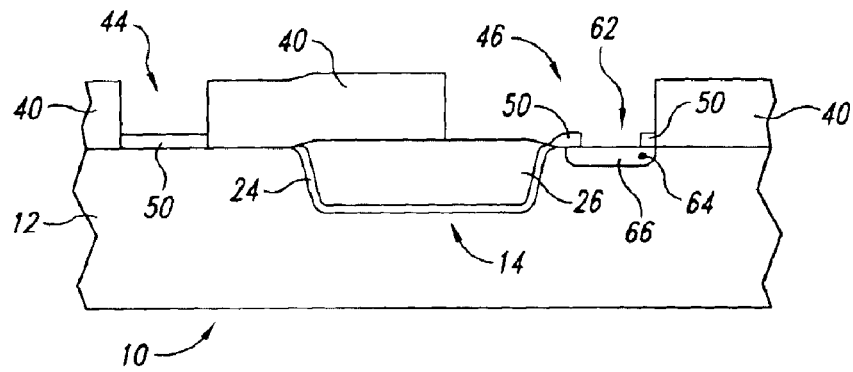
FIG. 7 is an illustration of a semiconductor structure at a subsequent stage of fabrication wherein the photoresist layer of FIG. 6 is stripped away.

Further, optional contact implants 64 are formed in the plug area 66. The contact implant 64 is provided to keep the contact from shorting to the substrate. According to one embodiment of the present invention, the contact implants 64 will merge with source/drain implants for device connection. Thus contact implants may be formed in either of the gate/local interconnect trenches 44, 46 where an interconnect is formed. It will be appreciated that depending upon the application, either no implants, or alternative types of implants may also be used. For example, implants with low ion energies may be used to construct a field threshold voltage ($V_t$) implant to improve electrical isolation between active areas that are separated by isolation trenches and isolation regions. This occurs because the implant reduces the doping profile, which thus reduces the electrical field and leakage. Other types of implants including threshold implants, graded channel implants, or any other punch through implants suitable for the intended application may also be embedded into the base substrate 12. The resist or mask 60 is then stripped off as illustrated in FIG. 7.

Figure 8:
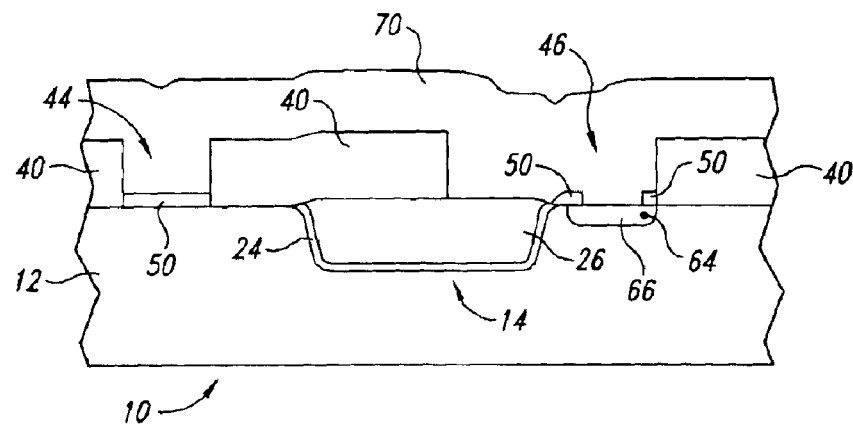
FIG. 8 is an illustration of a semiconductor structure at a subsequent stage of fabrication wherein a conductive layer is deposited over the semiconductor structure of FIG. 7 according to one embodiment of the present invention.

Referring to FIG. 8, a conductive layer 70 is deposited over the structure 10. The conductive layer 70 forms both the gate conductor and local interconnect conductor. The conductive layer 70 comprises for example, a metal, an alloy, a metal-based material, polysilicon, or a polysilicon based material.

Figure 9A:
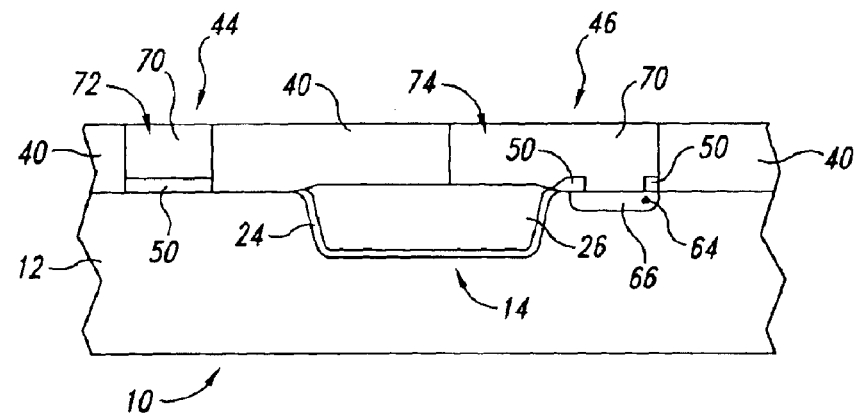
FIG. 9A is an illustration of a semiconductor structure at a subsequent stage of fabrication wherein the conductive layer of FIG. 8 is polished back so as to be substantially flush with the ILD layer according to one embodiment of the present invention.

As illustrated in FIG. 9A, the structure 10 is then planarized using CMP techniques or other suitable techniques to remove the overburden of the conductive layer 70. Subsequent to the planarizing process, the conductive layer 70 that filled the gate/local interconnect trench 44 defines the gate conductor 72, and the conductive layer 70 that filled the gate/local interconnect trench 46 defines a local interconnect conductor 74. Additionally, it will be appreciated that other locations at different cross-sections of the trench 44 can define local interconnect conductors (e.g., contacts), and similarly other cross-sections of the trench 46 can define gate conductors (e.g., gate lines).

If the conductive layer 70 comprises a layer of polysilicon, a further doping operation is performed. For example, a polysilicon conductive layer 70 is deposited using a CVD process to a thickness generally between 500 Angstroms and 3000 Angstroms. If it is desired to dope the polysilicon to an n-type, then a diffusion, ion implantation, or other process is performed to sufficiently dope the polysilicon with an n-type substance such as phosphorous. Likewise, if it is desirable to dope the polysilicon to a p-type, then a p-type material such as boron is implanted into the polysilicon. The polysilicon is then annealed.

Figure 9B:
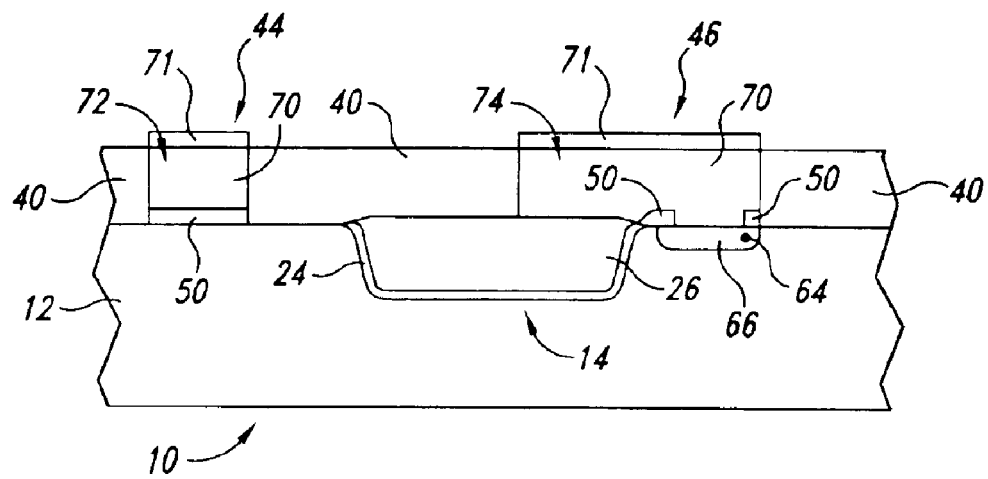
FIG. 9B is an illustration of a semiconductor structure at a subsequent stage of fabrication similar to that illustrated in FIG. 9A, wherein the damascene gate conductive material comprises polysilicon and the structure further includes an optional silicide layer formed over the damascene gate polysilicon according to one embodiment of the present invention.

Referring to FIG. 9B, a silicide layer 71 may be formed on a polysilicon conductive layer. For example, if a silicide is desired over the damascene gate 90, a film, or transition material such as a Group VII element (W or Mo for example), is deposited onto the polysilicon conductive layer 70. A subsequent anneal forms the silicide, and chemical etches remove the un-reacted, deposited film from the top of the ILD layer 40.

Figure 10:
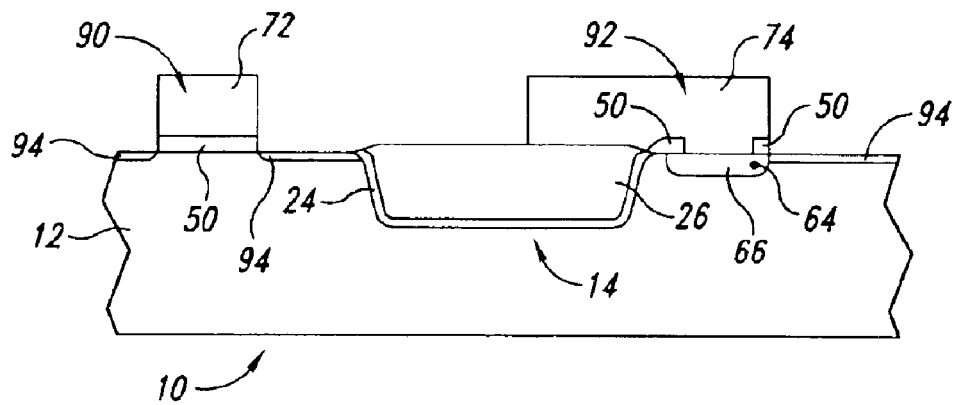
FIG. 10 is an illustration of a semiconductor structure at a subsequent stage of fabrication wherein the ILD layer of FIG. 9A is removed.

The ILD layer 40 is then stripped away, as illustrated in FIG. 10. An etch may be performed to remove the ILD layer 40 (not shown) leaving a damascene gate structure 90 and a local interconnect damascene structure 92. At this point, any further doping that has not already been completed is performed. For example, it may be desirable to reduce channel resistance or increase speed parameters, thus an ion implant is used to form the optional lightly doped drain regions (LDD) 94.

Figure 11:
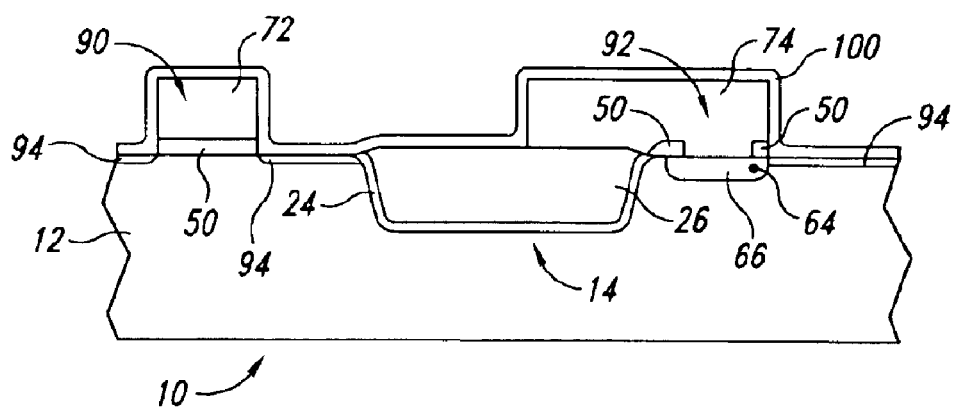
FIG. 11 is an illustration of a semiconductor structure at a subsequent stage of fabrication wherein a spacer layer is deposited over the damascene gate, local interconnect, and base substrate according to one embodiment of the present invention.
Figure 12A:
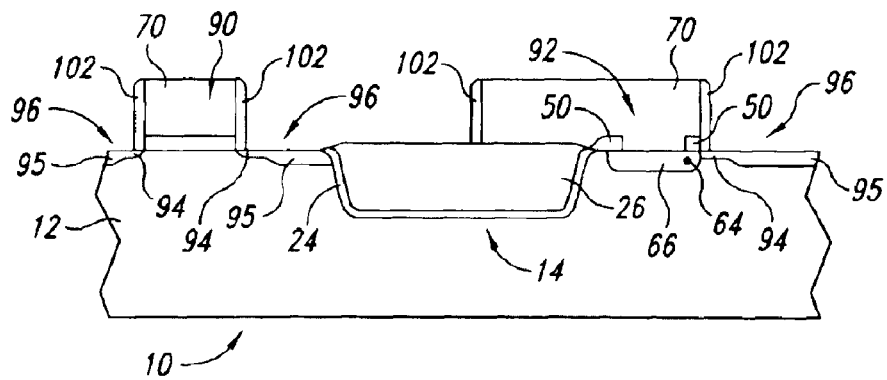
FIG. 12A is an illustration of a semiconductor structure at a subsequent stage of fabrication wherein spacers are formed on the damascene gate and local interconnect structures of FIG. 11 and subsequent source/drain implants are performed according to one embodiment of the present invention.

FIG. 11 illustrates a spacer layer 100 deposited over the structure 10. As illustrated, the spacer layer 100 is generally conformal. The spacer layer 100 comprises, for example, a layer of oxide or nitride deposited using CVD at a thickness generally between 500–1000 Angstroms. Referring to FIG. 12A, portions of the spacer layer 100 are removed to define spacers 102 against the vertical walls of the gate structure 90 and the local interconnect structure 92. The spacers 102 may have a rounded or curved edge by etching all horizontally disposed regions of the spacer layer 100 (not shown) such as by applying a directed reactive ion beam downwardly onto the substrate 12. Such a process is anisotropic and thus material is removed substantially vertically, but other anisotropic etching techniques may also be used.

After the etch is complete, a further ion implantation is performed to define the doped regions 95. The ion implant is at a higher concentration and energy than the previous implant, thus the doped regions 95 are illustrated as having a deeper penetration into the base substrate adjacent to the portion of the LDD regions 94 underneath the spacers 102. The LDD regions 94 and the doped regions 95 jointly define the doped source/drain regions 96. It will be appreciated that depending upon the intended application, one or both of the implant steps may be eliminated from the manufacturing steps. It will further be appreciated that the source/drain regions 96 may be implanted during other processing steps.

Figure 12B:
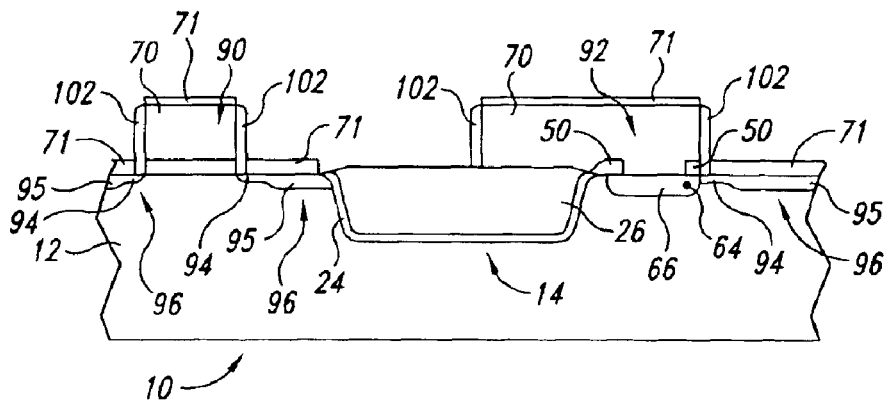
FIG. 12B illustrates the formation of optional silicide layers over the damascene gate and within the local interconnect according to one embodiment of the present invention.

When the conductive layer comprises a polysilicon, an optional silicide layer may be desirable. Referring to FIG. 12B, after forming of the spacers 102 and further doping the substrate to form the source/drain regions 96, the silicide layer 71 is deposited over the structure 10. The silicide layer 71, for example, can be cobalt. After a subsequent anneal process, $CoSi_x$ is formed on the polysilicon conductive layer 70 and the active areas, including the doped source/drain regions 96. The silicide layer 71 serves to lower the resistance of the polysilicon conductive layer 70 and source/drain regions 96. Subsequent etching removes the un-reacted film (cobalt) from the spacers 102 and other dielectric materials.

Figure 13:
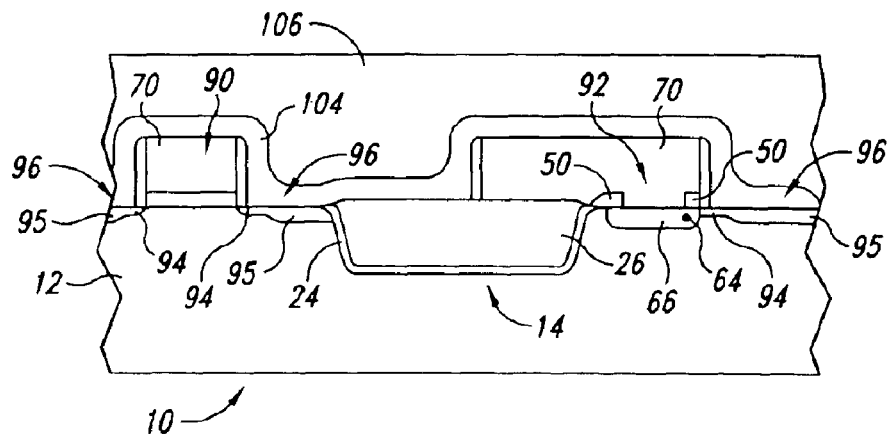
FIG. 13 is an illustration of a semiconductor structure at a subsequent stage of fabrication wherein dielectric layers are formed over the structure of FIG. 12A, according to one embodiment of the present invention.

FIG. 13 shows a dielectric layer 104, such as a conformal tetraethyloxysilicate (TEOS), oxide, or nitride layer, deposited over the structure 10. The dielectric layer 104 serves as a barrier layer for subsequent manufacturing processes. A thick dielectric layer 106 is also deposited over the dielectric layer 104. It shall be appreciated that additional processing steps may be performed to connect the damascene gate 90 and the local interconnect damascene 92 to additional layers of metallization. For example, the gate structure 90 and/or the local interconnect structure 92 may be connected to Back End Of Line wiring (BEOL). The BEOL wiring completes the circuits designed within the integrated circuit device.

Figure 14:
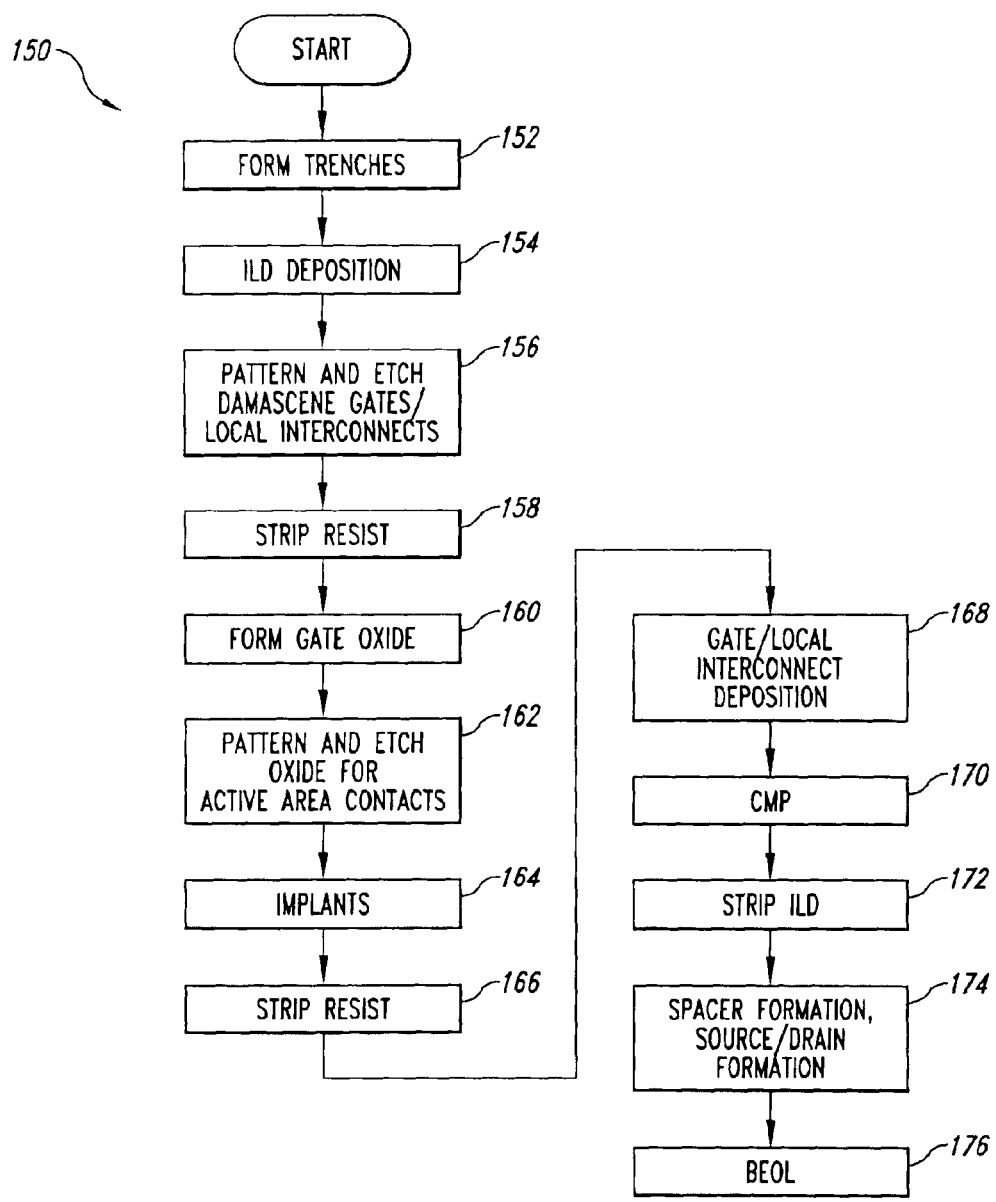
FIG. 14 is a flow chart illustrating the stages of manufacturing a damascene gate and local interconnect according to one embodiment of the present invention.

FIG. 14 is a flow chart illustrating a method of fabricating a semiconductor device according to one embodiment of the present invention. The method 150 comprises forming isolation trenches in the base substrate in operation 152. An ILD layer is deposited over the base substrate in operation 154, then a patterning and etching process is performed to define gate/local interconnect trenches in operation 156. Any residual resist material is then stripped in operation 158. A layer of gate oxide is formed at least within the gate/local interconnect trenches at areas where gates are to be formed in operation 160. If oxide is formed on the base substrate in the areas that define local interconnects, such as contacts to an active area, a patterned oxide etch is performed to remove at least a portion of the oxide from the base substrate within the gate/local interconnect trenches in the areas to define local interconnects in operation 162. Any desired materials are implanted in operation 164, and residual resist is stripped in operation 166. A conductive layer is then deposited forming the damascene gate lines and local interconnect contacts within the gate/local interconnect trenches in operation 168. A polishing process is performed to polish back the conductive layer to the ILD layer in operation 170. Next, the ILD layer is stripped in operation 172, and then any required doping is performed, such as LDD doping to form source and drain regions of active area. Spacers are then formed adjacent to the gates and local interconnects in operation 174. Finally, any required back end of line wiring is completed in operation 176.

The SRAM Memory Cell

A few examples of the numerous applications for the techniques and structures are set forth below with respect to SRAM memory cells. The following discussion illustrates how the structures described with references to FIGS. 1–13 are used to implement a memory cell schematically illustrated in FIG. 15.

Figure 15:
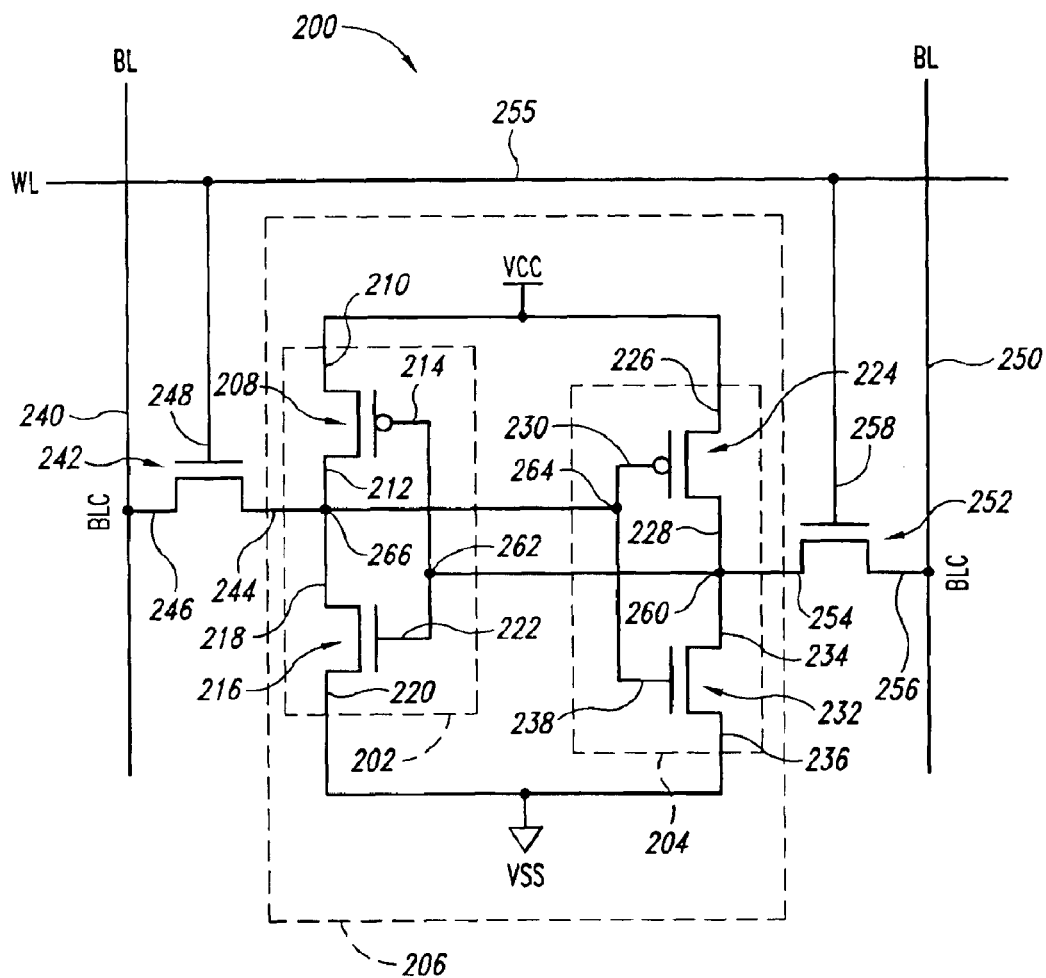
FIG. 15 is a schematic view of an SRAM memory cell according to one embodiment of the present invention.
Figure 16:
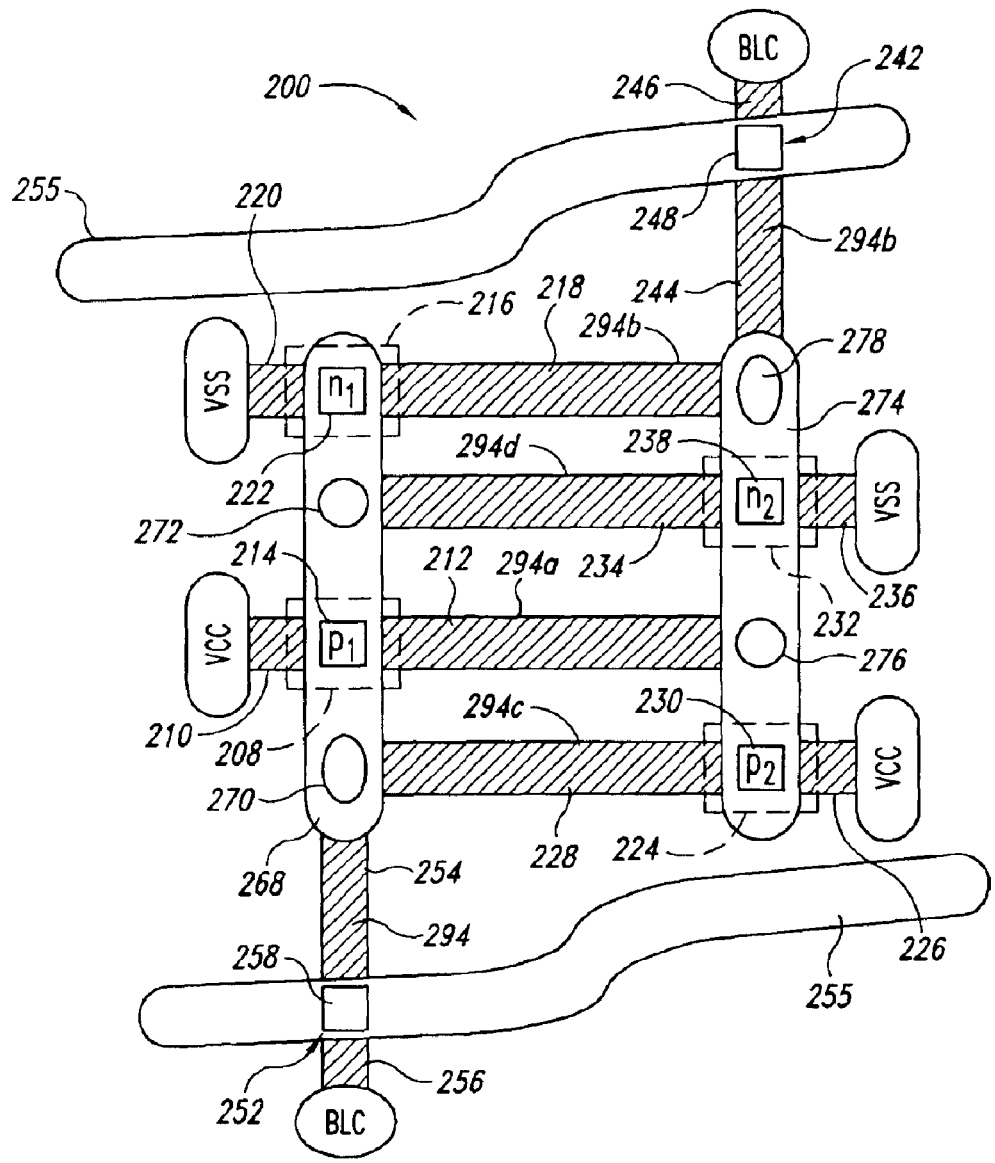
FIG. 16 illustrates a layout of an SRAM memory cell according to one embodiment of the present invention.
Figure 17:
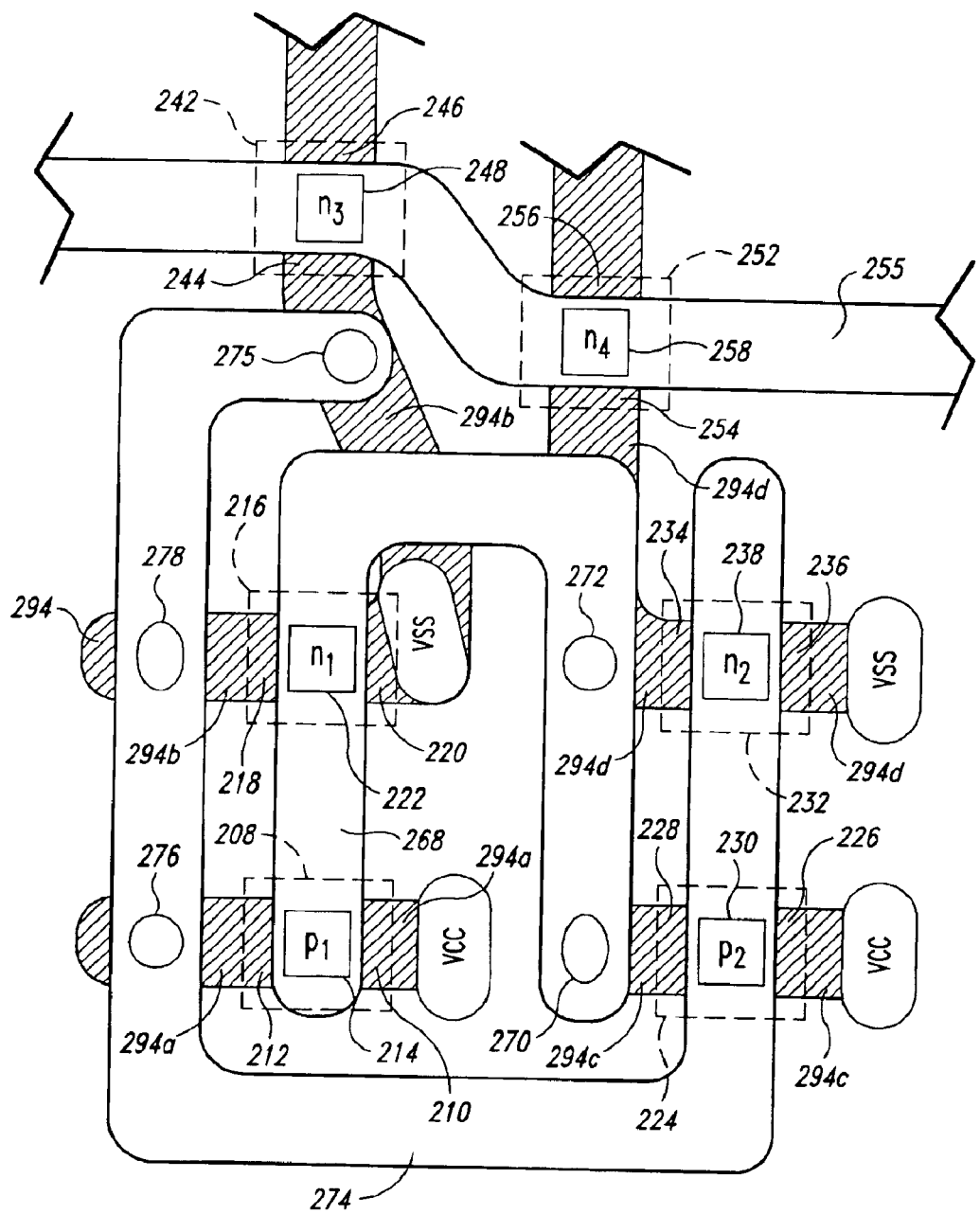
FIG. 17 illustrates a layout of an SRAM memory cell according to another embodiment of the invention.

FIG. 15 schematically illustrates typical SRAM memory cells, and FIGS. 16 and 17 illustrate two layouts for the SRAM memory cell of FIG. 15 constructed according to the techniques explained above with reference to FIGS. 1–14. As illustrated in FIG. 15, the SRAM memory cell 200 comprises a pair of inverters 202 and 204 that are cross-coupled to form a bi-stable flip-flop 206. The first inverter 202 comprises a first p-type transistor 208 and a first n-type transistor 216. The first p-type transistor 208 has first and second source/drain regions 210, 212 and a gate 214. The first n-type transistor 216 has first and second source/drain regions 218, 220 and a gate 222. The second inverter 204 comprises a second p-type transistor 224 and a second n-type transistor 232. The second p-type transistor 224 has first and second source/drain regions 226, 228 and a gate 230. The second n-type transistor 232 has first and second source/drain regions 234, 236 and a gate 238. The bi-stable flip-flop 206 is isolated from a bitline 240 by a first access transistor 242 having first and second source/drain regions 244, 246 and a gate 248. Likewise, the bi-stable flip-flop 206 is isolated from a compliment bitline 250 by a second access transistor 252 having first and second source/drain regions 254, 256 and a gate 258. Both the first and second access transistors 242, 252 are controlled by a common wordline 255. The operation of SRAM memory cells is well known in the art and will not be discussed herein.

The memory cell 200 also includes connection points 260 and 262, which are connected together to cumulatively couple the first p-type transistor gate 214, the first n-type transistor gate 222, the source/drain region 228 of the second p-type semiconductor 224, the source/drain region 234 of the second n-type transistor 232, and the source/drain region 254 of the second access transistor 252. Likewise, the memory cell 200 includes connection points 264 and 266, which are connected together to cumulatively couple the source/drain region 212 of the first p-type transistor 208, the source/drain region 218 of the first n-type transistor 215, the source/drain region 244 of the first access transistor 242, the gate 230 of the second p-type transistor 224, and the gate 238 of the second n-type transistor 232.

The schematic diagram in FIG. 15 is presented to clarify the physical layouts of the SRAM memory cells illustrated in FIGS. 16 and 17 and constructed as explained above with reference to FIGS. 1–14. It will be appreciated that FIGS. 16 and 17 are not drawn to scale. As such, certain proportions of FIGS. 16 and 17 are exaggerated to facilitate an explanation of certain aspects of these embodiments.

FIG. 16 illustrates one embodiment of the memory cell 200 comprising a first contiguous conductive line 268 and a second contiguous conductive line 274 coupled together by first, second, third, and fourth strips of active areas 294 (identified individually by reference numbers 294a–d). The contiguous conductive lines are strips of conductive material that are formed using a single pattern/etch process, a single deposition operation, and a single planarization procedure. The first and second conductive lines 268, 274 are also referred to herein as first and second strips 268 and 274, respectively. The first and second conductive strips 268, 274 shown in the embodiment of FIG. 16 are straight conductive segments. The first and second strips 268, 274 form either a transistor (illustrated as a dashed box) or a contact (illustrated as a round or elliptical shape) at each crossing over an active area 294. The first and second strips 268, 274, and the wordline 255 form conductive interconnects and may be fabricated as a damascene lines in trenches as discussed above with reference to FIGS. 1–14.

The gate 214 of the first p-type transistor and the gate 222 of the first n-type transistor 216 are constructed as part of first strip 268 by building damascene gate structures like the damascene gate structure 90 illustrated in FIG. 13. Referring back to FIG. 16, the first contact 270 and the second contact 272 are constructed as part of the first strip 268 by building damascene local interconnect structures like the damascene local interconnect structure 92 illustrated in FIG. 13. The second p-type transistor 224 and the second n-type transistor 232 are constructed as part of the second strip 274 by building damascene gate structures like the damascene gate structure 90 illustrated in FIG. 13. Referring back to FIG. 16, the third and fourth contacts 276 and 278 are constructed as part of the second strip 274 by building damascene local interconnect structures like the damascene local interconnect structure 92 illustrated in FIG. 13.

The active areas 294 represent various dopings in the base substrate that extend under the strips 268 and 274. For example, the active areas 294 may comprise the LDD regions 94 illustrated in FIG. 11, the doped regions 95 illustrated in FIGS. 12A–13, and/or the doped source/drain regions 96 illustrated in FIGS. 12A–13. The active areas 294 may alternatively include implants such as the contact implants 64 illustrated in FIGS. 6–13. The contact implants 64 prevent the active area contact from shorting to the base substrate. The contact implants 64 further merge with the doped source/drain regions for device connection.

It will be observed that the common wordline 255 is schematically illustrated in FIG. 15 as a single continuous wordline. However, as illustrated in the layout of FIG. 16, the wordline 255 can be two separate wordlines 255. By providing two separate wordlines that carry the same signal, fabrication symmetry is more easily achieved. This also allows the pull down transistors to be fabricated substantially identically and allows greater cell stability.

Referring back to FIG. 16, the connections for connection points 260 and 262 (FIG. 15) are formed according to one embodiment of the present invention using only the first strip 268, the second strip 274, and the active areas 294. The first p-type transistor gate 214 and the first n-type transistor gate 222 are formed in the first strip 268 over areas where an oxide is between the first strip 268 and the underlying active area 294. The source/drain region 228 of the second p-type transistor 224 is coupled to the first strip 268 via one of the active areas 294 and the first contact 270. The source/drain region 234 of the second n-type transistor 232 is coupled to the first strip 268 via another active area 294 and the second contact 272. The source/drain region 254 of the second access transistor 252 is coupled to the first p-type and n-type transistors 208 and 216 by the first strip 268, an active area 294 and the first contact 270.

The source/drain region 212 of the first p-type transistor 208 is coupled to the second strip 274 via an active area 294 and the third contact 276, and the source/drain region 218 of the first n-type transistor 216 is coupled to the second strip 274 via another active area 294 and the fourth contact 278. The source/drain region 244 of the first access transistor 242 is coupled to the second p-type and n-type transistors 224, 232 by the second strip 274, an active area 294 and the fourth contact 278. The gate 230 of the second p-type transistor 224 and the gate 238 of the second n-type transistor 232 are formed in the second strip 274.

It will be appreciated that the n-doped active area (source/drain region 254 of the second access transistor 252) must be shorted to the p-doped active area (source/drain region 228 of the second p-type transistor 224). Likewise, the n-doped active area (source/drain region 244 of the first access transistor 242) must be shorted to the n-doped active area (source/drain region 218 of the first n-type transistor 216).

The active areas 294 can include four active areas that electrically couple particular contacts to particular transistors. The active areas 294 can include the following: a first active area 294a electrically coupling the first p-type transistor 208 to the third contact 276; a second active area 294b electrically coupling the first n-type transistor 216 to the fourth contact 278; a third active area 294c electrically coupling the second p-type transistor 224 to the first contact 270; and a fourth active area 294d electrically coupling the second n-type transistor 232 to the second contact 272. The second active area 294b also electrically couples the first access transistor 242 to the fourth contact 278, and the third active area 294c also electrically couples the second access transistor 252 to the first contact 270.

FIG. 17 illustrates another embodiment of the memory cell 200 including other layouts for the first contiguous conductive line 268 and the second contiguous line conductive line 274. This embodiment of the memory cell 200 also comprises alternative embodiments of the first-fourth active areas 294a–d. In this embodiment, the first strip 268 has a C-shape or a U-shape, and the second strip 274 has a C-shape or U-shape that is inverted with respect to the first strip 268. The second strip 274 also surrounds at least a portion of the first strip 268, such as the open end and the legs of the first strip 268. The first and second strips 268 and 274, and the word line 255, form conductive interconnects that may be fabricated as damascene lines as discussed above with reference to FIGS. 1–14.

The first strip 268 is a contiguous conductive line that defines a first gate line at the gate 214 of the first p-type transistor 208, a second gate line at the gate 222 of the first n-type transistor, a first local interconnect contact 270, and a second local interconnect contact 272. The first gate line of the first p-type transistor 208 is accordingly located at a first gate site over the first active area 294a, and the second gate line for the first n-type transistor 216 is located at a second gate site over the second active area 294b. The first contact 270 is coupled directly to the third active area 294c without an oxide over this portion of the third active area 294c, and the second contact 272 is coupled directly to the fourth active area 294d without an oxide over this portion of the fourth active area 294d.

The second conductive line 274 defines a third gate line for the gate 230 of the second p-type transistor 224, a fourth gate line for the gate 238 of the second n-type transistor 232, a third local interconnect contact 276, and a fourth local interconnect contact 278. The third gate line of the gate 230 is located at a third gate site over a portion of the third active area 294c, and the fourth gate line for the gate 238 is located at a fourth gate site over a portion of the fourth active are 294d. The third contact 276 is coupled directly to the first active area 294a without an oxide over this portion of the first active area 294a, and the fourth contact 278 is coupled directly to the second active area 294b without an oxide over this portion of the second active area 294b. The memory cell 200 in FIG. 17 further includes a fifth contact 275 defined by a portion of the second strip 274 that is electrically connected to the second active area 294b proximate to the first access transistor 242.

The first access transistor 242 is shorted to the second strip 274 by the second active area 294b and the fifth contact 275. The second access transistor 252 is shorted to the first strip 268 by the second contact 272. As such, the contacts that short the first and second access transistors to the appropriate strips are slightly different in the embodiments of the memory cells 200 shown in FIGS. 16 and 17.

In both of the embodiments of the memory cells 200 shown in FIGS. 16 and 17, the first active area 294a is coupled to a Vcc contact, the second active area 294b is coupled to a Vss contact, the third active area 294c is coupled to another Vcc contact, and the fourth active area 294d is coupled to another Vss contact. In both embodiments, the first and second strips 268, 274 for an SRAM cell are formed using only a single pattern/etch procedure, a single deposition procedure to provide the conductive material for the gate lines and the interconnect contacts defined by the first and second strips, and a single chemical-mechanical planarizing process to electrically isolate the conductive material in the trenches. It will be appreciated that the cell layouts shown in FIGS. 16 and 17 provide high-performance SRAM devices in a simple layout that can be achieved using fewer processing steps compared to conventional SRAM cell layouts. This is expected to enhance the reliability, manufacturing control, and cost of producing SRAM devices.

Figure 18:
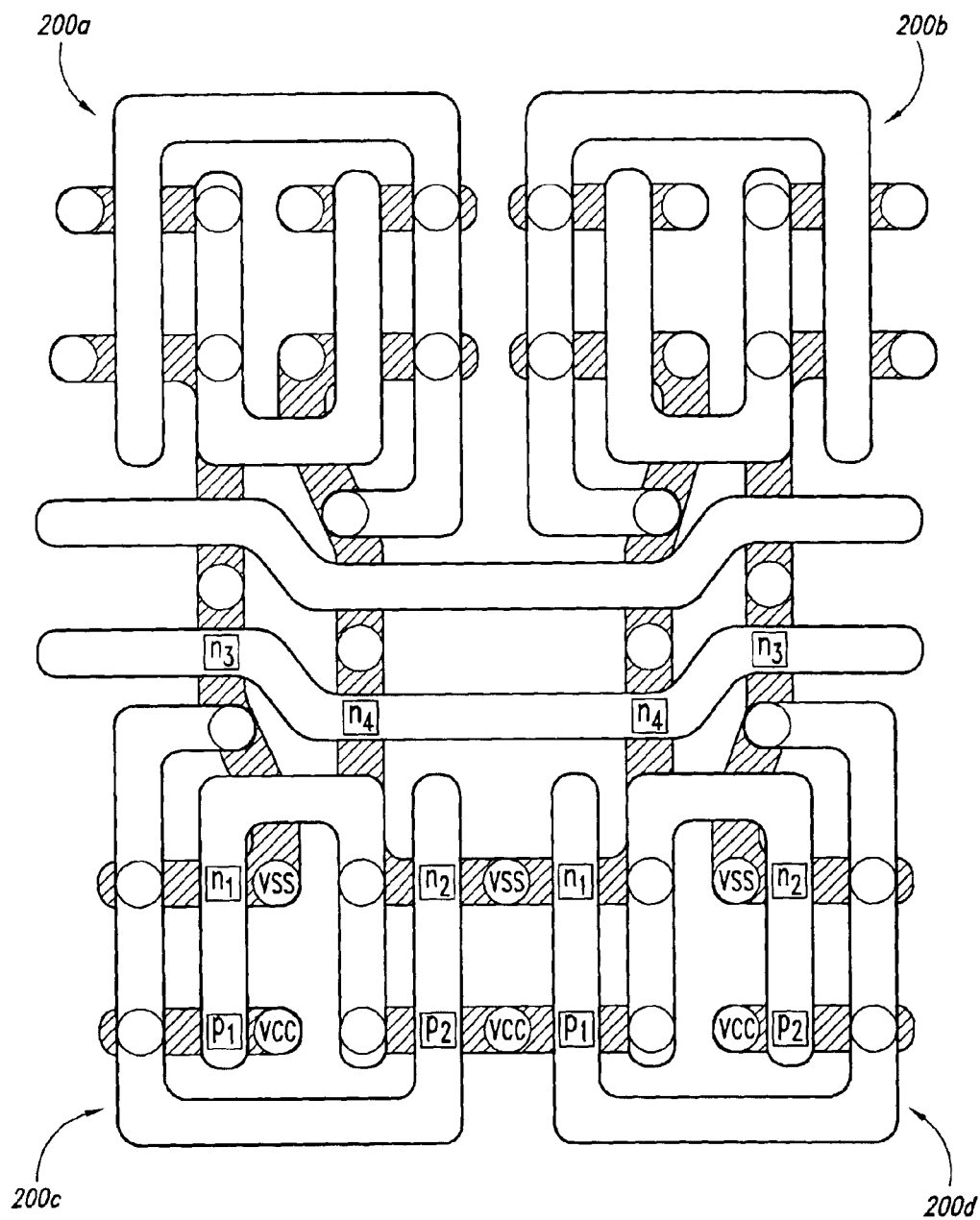
FIG. 18 illustrates a layout of a plurality of the SRAM memory cells shown in FIG. 17.

FIG. 18 is an illustration of a final layout of four individual memory cells 200a–d that are arranged in an SRAM device. Each memory cell 200a–d is similar to the memory cell 200 shown in FIG. 17. It will be appreciated that all four memory cells 200a–d can be fabricated on a workpiece simultaneously.

Figure 19:
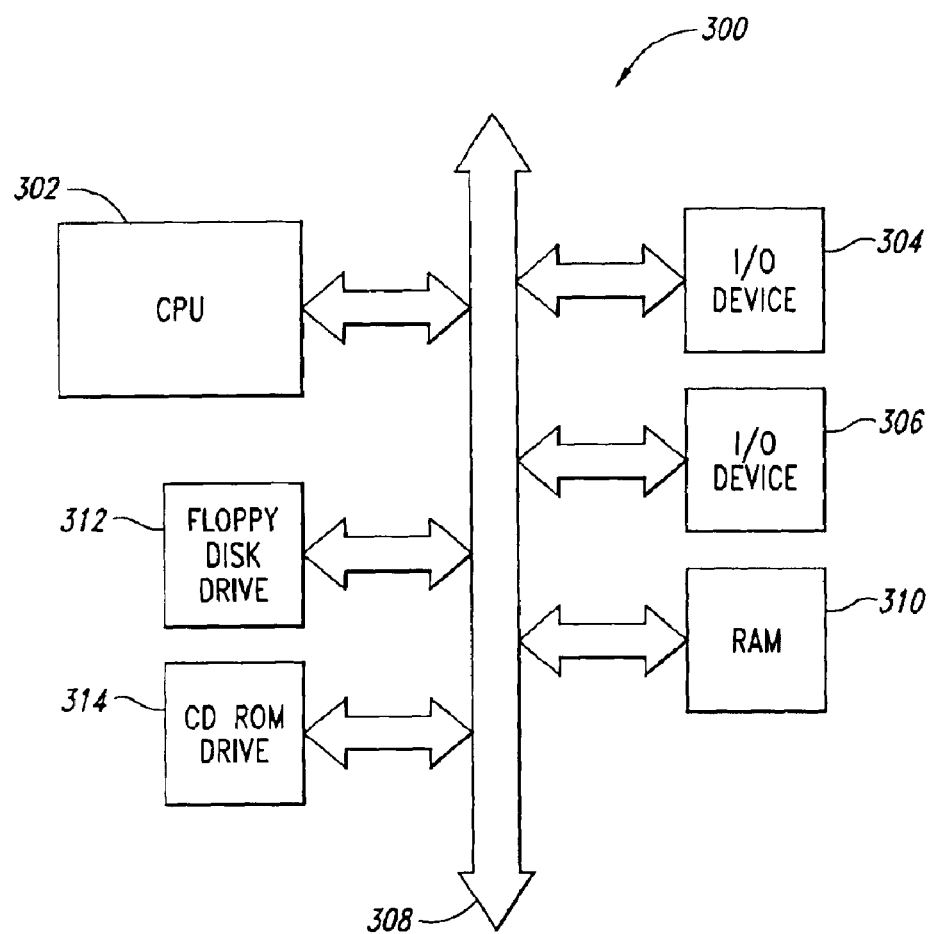
FIG. 19 is a block diagram of a computer system using an SRAM memory device according to one embodiment of the present invention.

The memory cells illustrated with reference to FIGS. 15–18 can be used to construct memory devices suitable for use with general computer systems as illustrated in FIG. 19. A general computer system 300 comprises a microprocessor or central processing unit 302, that communicates with input/output (I/O) devices 304, 306 over a bus 308. It will be appreciated that any number of I/O devices can be used, and the selection of I/O devices will depend upon the application for which the computer system 300 is intended. The computer system 300 also includes random access memory (RAM) 310 and may include peripheral devices such as a floppy disk drive 312 and a compact disk (CD) ROM drive 314. The CPU 302 communicates with the other devices over the bus 308. The computer system 300 is an example of a digital device that includes memory devices. Other types of dedicated processing systems include, for example, radio systems, television systems, GPS receiver systems, telephones and telephone systems.

The foregoing methods and/or cell layouts reduce the number of expensive processing steps, which reduces capital costs for equipment and manufacturing costs of fabricating devices. It should be noted that the exact architecture of the computer system 300 is not important and that any combination of computer compatible devices may be incorporated into the system.

Having described several embodiments of the invention in detail, it will be apparent that modifications and variations are possible without departing from the scope of the invention defined in the appended claims. For example, the invention can include other embodiments that are directed to other types of microelectronic devices, such as processors. The invention can accordingly include other embodiments that have different features, or may not include some of the features, of the foregoing embodiments described above with reference to FIGS. 1–18.

What is claimed is:

1. A memory device cell, comprising:
    a first conductive line having a first gate, a second gate, a first contact, and a second contact, wherein the first conductive line is a contiguous first metal line;
    a second conductive line having a third gate, a fourth gate, a third contact, and a fourth contact, wherein the second conductive line is a contiguous second metal line, the first and second metal lines being formed from a single metal deposition;
    a first active area electrically coupled to the first gate and the third contact;
    a second active area electrically coupled to the second gate and the fourth contact;
    a third active area electrically coupled to the third gate and the first contact; and
    a fourth active area electrically coupled to the fourth gate and the second contact.

2. The memory device cell of claim 1, wherein the first conductive line is a contiguous first polysilicon line and the second conductive line is a contiguous second polysilicon line, the first and second polysilicon lines being formed from a single deposition.

3. The memory device cell of claim 1, further comprising:
    a first Vcc contact electrically coupled to the first active area;
    a second Vcc contact electrically coupled to the third active area;
    a first Vss contact electrically coupled to the second active area; and
    a second Vss contact electrically coupled to the fourth active area.

4. The memory device cell of claim 1, further comprising:
a first access transistor electrically coupled to the second conductive line; and
a second access transistor electrically coupled to the first conductive line.

5. The memory device cell of claim 1 wherein the first conductive line is a first straight conductive segment and the second conductive line is a second straight conductive segment.

6. The memory device cell of claim 1 wherein the first conductive line has a first shape and the second conductive line has a second shape that surrounds at least a portion of the first conductive line.

7. A memory device cell, comprising:
a plurality of active areas including a first active area electrically coupled to a Vcc contact, a second active area electrically coupled to a Vss contact, a third active area electrically coupled to a Vcc contact, and a fourth active area electrically coupled to a Vss contact;
a first conductive line having a first gate at the first active area defining a first p-type transistor, a second gate at the second active area defining a first n-type transistor, a first contact at the third active area, and a second contact at the fourth active area, wherein the first conductive line is a contiguous first metal line; and
a second conductive line having a first gate at the third area defining a second p-type transistor, a second gate at the fourth active area defining a second n-type transistor, a third contact at the first active area, and a fourth contact at the second active area, wherein the second conductive line is a contiguous second metal line, the first and second metal lines being formed from a single metal deposition.

8. The memory device cell of claim 7 wherein the first conductive line is a contiguous first polysilicon line and the second conductive line is a contiguous second polysilicon line, the first and second polysilicon lines being formed from a single deposition.

9. The memory device cell of claim 7 wherein the first conductive line is a first straight conductive segment and the second conductive line is a second straight conductive segment.

10. The memory device cell of claim 7 wherein the first conductive line has a first shape and the second conductive line has a second shape that surrounds at least a portion of the first conductive line.

11. A memory device cell, comprising:
a first conductive line having a first gate line of a first p-type transistor at a first active area, a second gate line of a first n-type transistor at a second active area, a first contact electrically coupled to a third active area, and a second contact electrically coupled to a fourth active area, wherein the first conductive line is a contiguous line formed by a single conductive deposition;
a second conductive line having a third gate line of a second p-type transistor at the third active area, a fourth gate line of a second n-type transistor at the fourth active area, a third contact electrically coupled to the first active area, and a fourth contact electrically coupled to the second active area, wherein the second conductive line is a contiguous line formed by the single conductive deposition;
a first access transistor shorted to the second p-type and n-type gates by the second conductive line; and
a second access transistor shorted to the first p-type and n-type gates by the first conductive line.

12. The memory device cell of claim 11, further comprising a first wordline electrically coupled to the first access transistor and a second wordline electrically coupled to the second access transistor, wherein the wordlines are formed by the single conductive deposition.

13. The memory device cell of claim 11, further comprising a wordline electrically coupled to the first access transistor and the second access transistor, wherein the wordline is formed by the single conductive deposition.

14. A memory device cell, comprising:
a contiguous first conductive line defining a first gate line for a first p-type transistor, a second gate line for a first n-type transistor, a first local interconnect contact, and a second local interconnect contact;
a contiguous second conductive line defining a third gate line for a second p-type transistor, a fourth gate line for a second n-type transistor, a third local interconnect contact, and a fourth local interconnect contact;
a first access transistor shorted to the third and fourth gate lines by the second conductive line; and
a second access transistor shorted to the first and second gate lines by the first conductive line.

15. A computer system, comprising:
a bus;
a central processing unit coupled to the bus; and
a memory device coupled to the bus, the memory device having a cell comprising
a first conductive line having a first gate, a second gate, a first contact, and a second contact, wherein the first conductive line is a contiguous first metal line;
a second conductive line having a third gate, a fourth gate, a third contact, and a fourth contact, wherein the second conductive line is a contiguous second metal line, the first and second metal lines being formed from a single metal deposition;
a first active area electrically coupled to the first gate and the third contact;
a second active area electrically coupled to the second gate and the fourth contact;
a third active area electrically coupled to the third gate and the first contact; and
a fourth active area electrically coupled to the fourth gate and the second contact.

16. The computer system of claim 15 wherein the first conductive line is a contiguous first polysilicon line and the second conductive line is a contiguous second polysilicon line, the first and second polysilicon lines being formed from a single deposition.

17. The computer system of claim 15, further comprising:
a first Vcc contact electrically coupled to the first active area;
a second Vcc contact electrically coupled to the third active area;
a first Vss contact electrically coupled to the second active area; and
a second Vss contact electrically coupled to the fourth active area.

18. The computer system of claim 15, further comprising:
a first access transistor electrically coupled to the second conductive line; and
a second access transistor electrically coupled to the first conductive line.

19. The computer system of claim 15 wherein the first conductive line is a first straight conductive segment and the second conductive line is a second straight conductive segment.

20. The computer system of claim 15 wherein the first conductive line has a first shape and the second conductive surrounds at least a portion of the first conductive line.

21. A computer system, comprising:
   a bus;
   a central processing unit coupled to the bus; and
   a memory device coupled to the bus, the memory device having a cell comprising
      a plurality of active areas including a first active area electrically coupled to a Vcc contact, a second active area electrically coupled to a Vss contact, a third active area electrically coupled to a Vcc contact, and a fourth active area electrically coupled to a Vss contact;
      a first conductive line having a first gate at the first active area defining a first p-type transistor, a second gate at the second active area defining a first n-type transistor, a first contact at the third active area, and a second contact at the fourth active area, wherein the first conductive line is a contiguous first metal line; and
      a second conductive line having a first gate at the third area defining a second p-type transistor, a second gate at the fourth active area defining a second n-type transistor, a third contact at the first active area, and a fourth contact at the second active area, wherein the second conductive line is a contiguous second metal line, the first and second metal lines being formed from a single metal deposition.

22. The computer system of claim 21 wherein the first conductive line is a contiguous first polysilicon line and the second conductive line is a contiguous second polysilicon line, the first and second polysilicon lines being formed from a single deposition.

23. The computer system of claim 21, further comprising:
   a first Vcc contact electrically coupled to the first active area;
   a second Vcc contact electrically coupled to the third active area;
   a first Vss contact electrically coupled to the second active area; and
   a second Vss contact electrically coupled to the fourth active area.

24. The computer system of claim 21, further comprising:
   a first access transistor electrically coupled to the second conductive line; and
   a second access transistor electrically coupled to the first conductive line.

25. The computer system of claim 21 wherein the first conductive line is a first straight conductive segment and the second conductive line is a second straight conductive segment.

26. The computer system of claim 21 wherein the first conductive line has a first shape and the second conductive surrounds at least a portion of the first conductive line.

27. A computer system, comprising:
   a bus;
   a central processing unit coupled to the bus; and
   a memory device coupled to the bus, the memory device having a cell comprising
      a first conductive line having a first gate line of a first p-type transistor, a second gate line of a first n-type transistor, a first contact, and a second contact, wherein the first conductive line is a contiguous first metal line formed by a single conductive deposition;
      a second conductive line having a third gate line of a second p-type transistor, fourth gate of a second n-type transistor, a third contact, and a fourth contact, wherein the second conductive line is a contiguous second metal line formed by the single conductive deposition;
      a first access transistor shorted to the third and fourth gate lines by the first conductive line; and
      a second access transistor shorted to the first and second gate lines by the second conductive line.

28. The computer system of claim 27, further comprising a first wordline electrically coupled to the first access transistor and a second wordline electrically coupled to the second access transistor, wherein the wordlines are formed by the single conductive deposition.

29. The computer system of claim 27, further comprising a wordline electrically coupled to the first access transistor and the second access transistor, wherein the wordline is formed by the single conductive deposition.

30. The computer system of claim 27 wherein the first conductive line is a contiguous first polysilicon line and the second conductive line is a contiguous second polysilicon line, the first and second polysilicon lines being formed from a single deposition.

31. The computer system of claim 27 wherein the first conductive line is a first straight conductive segment and the second conductive line is a second straight conductive segment.

32. The computer system of claim 27 wherein the first conductive line has a first shape and the second conductive line has a second shape that surrounds at least a portion of the first conductive line.

33. A computer system, comprising:
   a bus;
   a central processing unit coupled to the bus; and
   a memory device coupled to the bus, the memory device having a cell comprising
      a first gate for a first p-type transistor, a second gate for a first n-type transistor, a first contact, and a second contact all defined by a first conductive line, wherein the first conductive line is a contiguous first metal line;
      a third gate for a second p-type transistor, a fourth gate for a second n-type transistor, a third contact, and a fourth contact all defined by a second conductive line, wherein the second conductive line is a contiguous second metal line, the first and second metal lines being formed from a single metal deposition;
      a first access transistor shorted to the third and fourth gates by the second conductive line; and
      a second access transistor shorted to the first and second gates by the first conductive line.

34. A method of fabricating a memory cell, comprising:
   forming a first trench, a second trench, and a third trench in a dielectric layer in a single pattern/etch process, wherein the first trench has a first gate site at a first active area, a second gate site at a second active area, a first contact site at a third active area, and a second contact site at a fourth active area, and wherein the second trench has a third gate site at the third active area, a fourth gate site at the fourth active area, a third contact site at the first active area, and a fourth contact site at the second active area;
   depositing a conductive material into the first trench, the second trench, and the third trench in a single deposition process;

removing an overburden portion of the conductive material to form (a) a first conductive line that has a first gate line at the first gate site, a second gate line at the second gate site, a first contact at the first contact site, and a second contact at the second contact site, (b) a second conductive line that has a third gate line at the third gate site, a fourth gate line at the fourth gate site, a third contact at the third contact site, and a fourth contact at the fourth contact site, and (c) a third conductive line.

* * * * *